United States Patent [19]

Marek

[11] Patent Number: 5,247,256

[45] Date of Patent: Sep. 21, 1993

[54] RF RECEIVER COIL ARRANGEMENT FOR NMR SPECTROMETERS

[75] Inventor: Daniel Marek, Möriken, Switzerland

[73] Assignee: Spectrospin AG, Switzerland

[21] Appl. No.: 690,499

[22] Filed: Apr. 24, 1991

[30] Foreign Application Priority Data

Apr. 25, 1990 [DE] Fed. Rep. of Germany ........ 4013111

[51] Int. Cl.⁵ .............................................. G01V 3/00
[52] U.S. Cl. .................................... 324/321; 324/315
[58] Field of Search ............... 324/300, 314, 315, 307, 324/318, 321, 322

[56] References Cited

U.S. PATENT DOCUMENTS 3,826,972 7/1974 Day et al.
4,240,033 12/1980 Anderson et al. .................. 324/315

FOREIGN PATENT DOCUMENTS 0303095 2/1989 European Pat. Off.
55-131758 3/1979 Japan.

OTHER PUBLICATIONS

Styles et al., Journal of Magnetic Resonance 60, 397–404 (1984).
Hoult et al., Journal of Magnetic Resonance 24, 71–85 (1976).
Styles et al., Journal of Magnetic Resonance 84, 376–378 (1989).
Review of Scientific Instruments, vol. 55, No. 1, Jan. 1984, New York US, pp. 68–74 K. Carduner et al.: "Variable-temperature solid-state nuclear-magnetic-resoance probe for superconducting magnets ... ".
Review of Scientific Instruments, vol. 57, No. 3, Mar. 1986, New York US, pp. 404–409 M. G. Richards et al.: "Cryogenic GaAs FET amplifiers and their Use in NMR detection".
Review of Scientific Instruments, vol. 57, No. 3, Mar. 1986, New York US, pp. 410–413 L. J. Friedman et al.: "Direct detection of low-frequency NMR using a dc SQUID".
Review of Scientific Instruments, vol. 36, No. 10, 1965, New York US, pp. 1509–1510 S. Meiboom, R. C. Hewitt: "High Resolution NMR Probe Suitable for Use in a Superconducting Solenoid".

Primary Examiner—Louis Arana
Attorney, Agent, or Firm—Walter A. Hackler

[57] ABSTRACT

In the case of a nuclear magnetic resonance spectrometer containing a sample (1) arranged in a homogeneous magnetic field and being adjusted approximately to room temperature or a higher temperature, and a RF receiver coil (3) which is arranged around the sample (1) and cooled down to far below room temperature, for receiving nuclear magnetic resonance signals from the sample (1), at least certain parts of the RF receiver coil (3) are in thermal contact with a cooled platform (7). The connection lines of the RF receiver coil (3), the outer resonator wall (10), the pre-amplifier and the coolant transfer lines can be cooled by cold return gas. Thanks to this arrangement of the RF receiver coil (3), one achieves an optimum space factor, the thermal noise of the receiver system is drastically reduced, the Q factor of the resonant circuit is increased, and consequently the signal-to-noise ratio is improved.

27 Claims, 12 Drawing Sheets

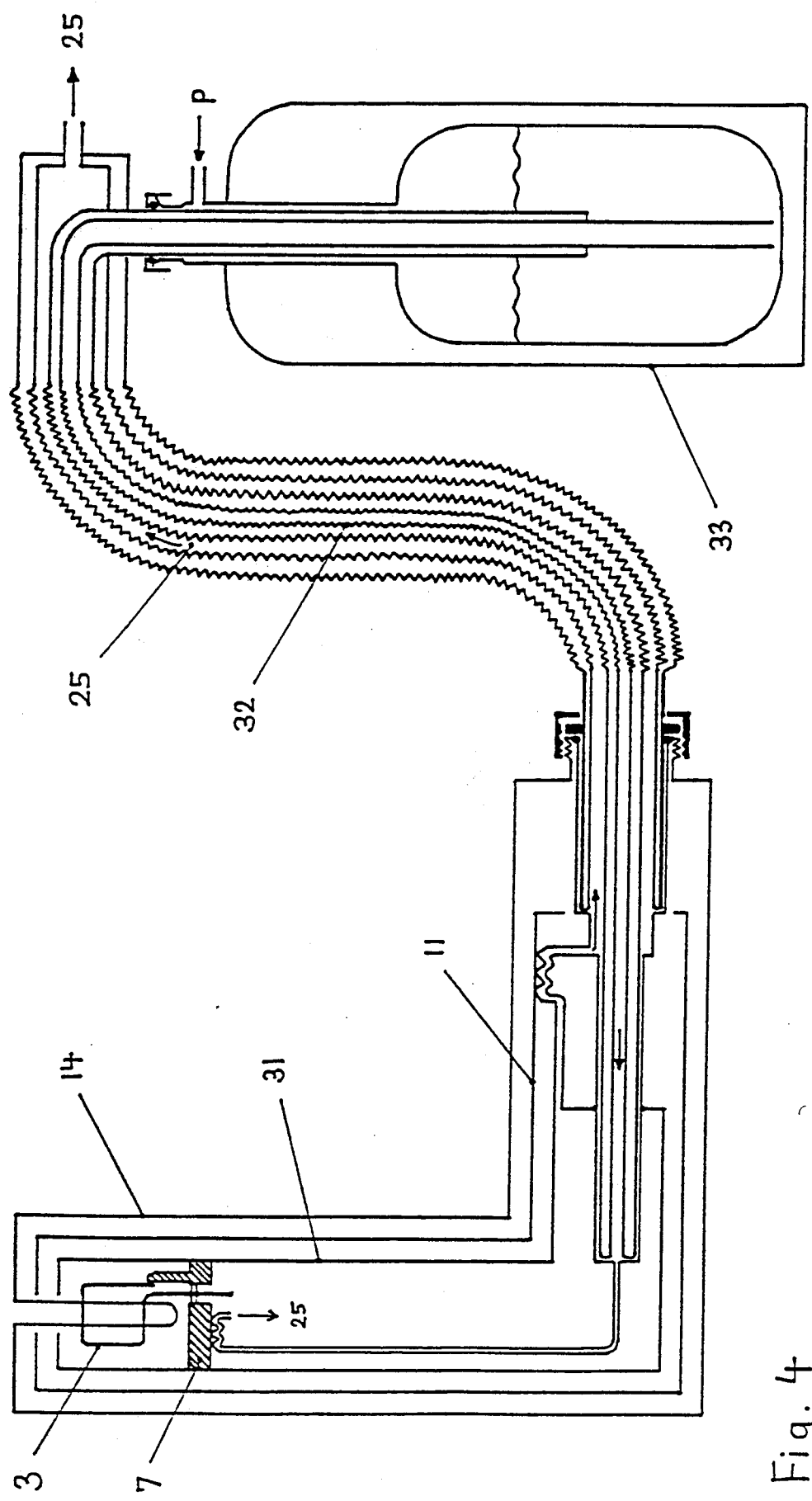

RF RECEIVER COIL ARRANGEMENT FOR NMR SPECTROMETERS

BACKGROUND OF THE INVENTION

The present invention relates to a RF receiver coil arrangement for NMR spectrometers comprising a RF receiver coil which is arranged around a sample and cooled down to far below room temperature, for receiving nuclear magnetic resonance signals from the sample, the latter being positioned in a homogeneous magnetic field and being adjusted substantially to room temperature or to a higher temperature.

Such a spectrometer RF receiver coil arrangement has been known from a paper by Hoult et al. published in Journal of Magnetic Resonance 24, 71–85 (1976). In the case of the arrangement described by this publication, the entire RF receiver coil is accommodated in a Dewar, which is cooled by means of a cryogenic liquid, and is isolated from the sample by a vacuum in a double-walled glass vessel. The main drawback of this conventional arrangement consists in the fact that the spacing between the sample and the RF receiver coil must be equal to at least the thickness of two glass walls plus the latter's spacing which contains the vacuum, which results in a significant reduction in space factor. Another disadvantage is seen in the system's the sensitiveness to position, and finally gas bubbles rising in the cooling liquid may also interfere with the measurement.

An improved cooled RF receiver coil arrangement for nuclear magnetic resonance spectrometers has been known from publications by Styles et al. (Journal of Magnetic Resonance 60, 397–404 (1984) and 84, 376–378 (1989)). In the case of this design, the RF receiver coil is positioned in a vacuum, is designed as a hollow tube, and is passed by a cryogenic liquid and is, thus, cooled from its inside. Compared with the before-mentioned conventional structure using a double-walled glass Dewar, one of these walls can be omitted when the RF receiver coil is placed in the vacuum. However, it is a substantial drawback of this arrangement that it restricts considerably the constructional freedom with respect to the RF receiver coil. The very limited choice of materials available for use makes it difficult to provide for the desired susceptibility compensation of the RF receiver coil, and results in certain losses as regards resolution and detection efficiency. In addition, the production of such a coil is difficult, and the design options for the coil are rather limited due to the fact that the tube forming the coil cannot be produced in any shape, and cannot be deformed at desire, either. This again has the result that it is not possible to achieve the best possible space factor. In addition, exchanging the RF receiver coil is rendered difficult, due to the necessary soldered joints. In cooled operation, the cryogenic agent which is forced through the tube under pressure may give rise to vibrations in the RF receiver coil which may result in susceptibility variations, a phenomenon which reduces the quality of the measurement still further. Finally, it has been noted in both of the before-mentioned publications that experiments conducted with the arrangement with internally cooled RF receiver coil led to only about half the improvement of the signal-to-noise ratio that had been expected theoretically.

SUMMARY OF THE INVENTION

Now, it is the object of the present invention to provide a RF receiver coil arrangement as hereinabove described wherein an improvement of the signal-to-noise ratio achieved as a result of the operation of the receiving system at low temperatures can be brought to full effect by minimizing the loss in space factor which results from the cooled arrangement of the receiver coil.

The invention achieves this object by an arrangement where at least certain parts of the RF receiver coil are in thermal contact with a cooled platform.

This structure enables the RF receiver coil to be cooled and to be isolated thermally from the sample, without there being the necessity to accept substantial restrictions as regards its shape or material. The RF receiver coil may have almost any geometry so that no room has to be wasted inside the coil, due to the isolation from the sample, and consequently the best possible space factor and, thus, a very high Q factor can be achieved for the resonant circuit. The compact design enables this detection arrangement to be employed also in a RF magnet system with correspondingly small magnet bore. Another advantage is seen in the fact that the RF receiver coil can be easily exchanged due to the fact that its electric connections need not be made or soldered in a vacuum-tight manner, as in the case of the internally cooled hollow coil, but can be guided to the outside by a simple soldered joint or, for example, a simple plug-and-socket connection. Given the fact that the cryogenic medium does not get into direct contact With the coil, there hardly exists a risk that vibrations may be transmitted to the RF receiver coil by the flow of the cryogenic medium.

According to one embodiment of the invention, the RF receiver coil consists of an electrically conductive, in particular a superconductive layer applied on a substrate. Given its extremely small three-dimensional extension this layer enables a particularly high space factor to be achieved. It has been found to be particularly advantageous if the layer consists of a material Which is superconductive at high temperature. In certain embodiments of the invention, the substrate upon which the electrically conductive layer is applied may consist of a sapphire quartz tube which either communicates directly with the cryogenic medium, or forms the cooled platform together with a metal block (Cu, Al, ...) arranged in the substrate and serving the function to transmit the heat to the cryogenic medium.

According to another embodiment of the invention, the RF receiver coil consists of a metal wire, in particular a wire containing high-purity copper or aluminium. The cooled platform may then also consist of a metal, in particular in the form of a copper block. According to a particularly advantageous variant of this embodiment of the invention, the RF receiver coil is in thermal contact with the cooled platform, at least along one of its connections, so that the coil itself can be arranged very close to the sample Whereby a high space factor can be achieved. In the case of one arrangement which is particularly favorable geometrically, the RF receiver coil is in thermal contact with at least one cooling finger projecting from the cooled platform.

According to another embodiment of the invention, the RF receiver coil is in thermal contact With the cooled platform at the coil center so that a symmetrical, RF-wise cold connection is achieved.

In one preferred embodiment of the invention, the RF receiver coil is arranged in a vacuum, in the area around the sample, and is enclosed by one or more radiation shields. The cold screening of the RF receiver coil makes it possible for the resonator to achieve a particularly high Q factor and leads to an additional thermal noise reduction because, when the geometrical relationships are selected appropriately, the screening is part of the receiving circuit, and, accordingly, responsible for part of the dampening effect. However, this dampening component has the effect to couple a certain noise component into the receiving circuit, which component may be quite considerable, depending on the particular circumstances. The noise signal is, however, largely dependent on the temperature of the screening.

The cooled design of the RF screening has the additional effect to reduce the radiation load on the receiver coil by up to half its value.

Low operating expenses are caused when the platform is cooled by liquid nitrogen. If lower operating temperatures of the detection system are to be reached, in order to reduce the thermal noise, then the platform may be cooled by liquid or gaseous helium.

As has been described before, the RF-wise "cold" coil connection can be connected to a metallic cooling platform without any problems (i.e. in a thermally and electrically conductive manner). The RF-wise "hot" connection of the receiver coil is normally connected to a coaxial cable, via a transformer network, and the coaxial cable is then guided to the pre-amplifier. In certain special cases, however, both the transformer network and/or the coaxial cable can be omitted. For the purposes of the present invention, the design of the RF-wise "hot" connection of the RF receiver coil is of interest only under thermal aspects.

According to one embodiment of the invention, the RF-wise hot connection of the coil is connected simply to the coaxial cable (as illustrated in FIG. 3) or to a transformer network, or else directly to a pre-amplifier (for example via a bore in the cooling platform). Cooling of the hot connection must then be effected across the entire receiver coil.

According to another embodiment of the invention, the hot connection of the receiver coil is connected to the cooling platform by means of a dielectric of high thermal conductivity (for example sapphire) and is, thus, cooled efficiently. This leads to the very advantageous situation that the receiver coil is thermally coupled to the cooling platform from both sides.

According to another embodiment of the invention, the bore in the cooling platform is sealed using an electrically non-conductive material. As a result of this arrangement, the receiver coil itself may be positioned in the vacuum while the connection is guided through a space through which a cooling agent is circulated so that it can be cooled very efficiently.

The two embodiments of the invention just described can be combined in an advantageous way by making the lead-through from a thermally highly conductive dielectric.

RF coupling to the space through which the cooling agent is circulated may, however, also be effected in a purely capacitive way, through a dielectric partition wall. A very advantageous variant of this embodiment of the invention is achieved when the wall consists of a dielectric of high thermal conductivity.

According to a preferred embodiment of the invention, the connection of the RF receiver coil, which is run through the cooled platform in the manner described before, leads to a pre-amplifier which is likewise surrounded by the helium return gas and which serves for amplifying the nuclear magnetic resonance signal from the sample. If the arrangement is chosen in this way, the helium return gas also cools the pre-amplifier, which leads to a considerable noise reduction. The pre-amplifier may then in particular be a gallium-arsenide pre-amplifier or a SQUID pre-amplifier.

According to another preferred embodiment of the invention, the RF receiver coil forms together with the surrounding cooling system a measuring head which can be inserted into the homogeneous magnetic field and which comprises a bore intended to receive the sample. Such a design of the detection system makes assembly, handling and maintenance, and any necessary exchange, particularly simple.

According to a particularly advantageous variant, the cooling system is designed as a flow-type cryostat having at least one transfer line to which liquid helium is supplied from a supply tank. The transfer line, which normally constitutes a dominating temperature leak in the cooling system, is surrounded during operation of the nuclear magnetic resonance spectrometer by helium return gas and is thereby cooled in an economic and simple manner.

In an embodiment of the invention, the innermost wall comprises a material of low RF losses selected from a group consisting of a metal of high electric conductivity and a superconductor. Cooling of the RF receiver coil arrangement according to the invention and/or of the RF screening may be effected by heat conduction in a metal block selected from a group consisting of high-purity AC and Cu, over distances in the range of half the length of the magnet.

An advantageous further development provides that the cryostat is equipped with an integrated supply tank for liquid helium and/or nitrogen, which contributes towards reducing the helium consumption while the system operates continuously under cooled conditions.

According to another embodiment of the invention, the cooling system is finally designed as a closed cooling circuit (cryocooler), which means that it is equipped with an integrated helium recovery and liquifying system, or else only with a circulation system for a gaseous cooling agent.

BRIEF DESCRIPTION OF THE DRAWINGS

The invention will now be described and explained in more detail by reference to the embodiment illustrated in the drawing. The features that can be derived from the specification and from the drawing may be used in other embodiments of the invention individually or in any combination. In the drawing:

FIG. 4 shows a schematic sectional view of an arrangement which is cooled by means of a cooled transfer line;

DESCRIPTION OF THE PREFERRED EMBODIMENTS

When carrying out nuclear magnetic resonance measurements on samples at temperatures of approx. 300 K (room temperature) and above, the signal-to-noise ratio is considerably improved if the RF receiver coil is maintained at a substantially lower temperature, for example at 77 K (temperature of nitrogen) or 4.2 K (temperature of helium). One of the critical problems with respect to the constructional design of such an installation resides in the question how the coil is to be cooled and to be insulated thermally from the sample. It is of predominant importance in this connection that the spacing between the RF receiver coil and the sample should be kept as small as possible in order to obtain the least possible loss in space factor.

Figure 1:
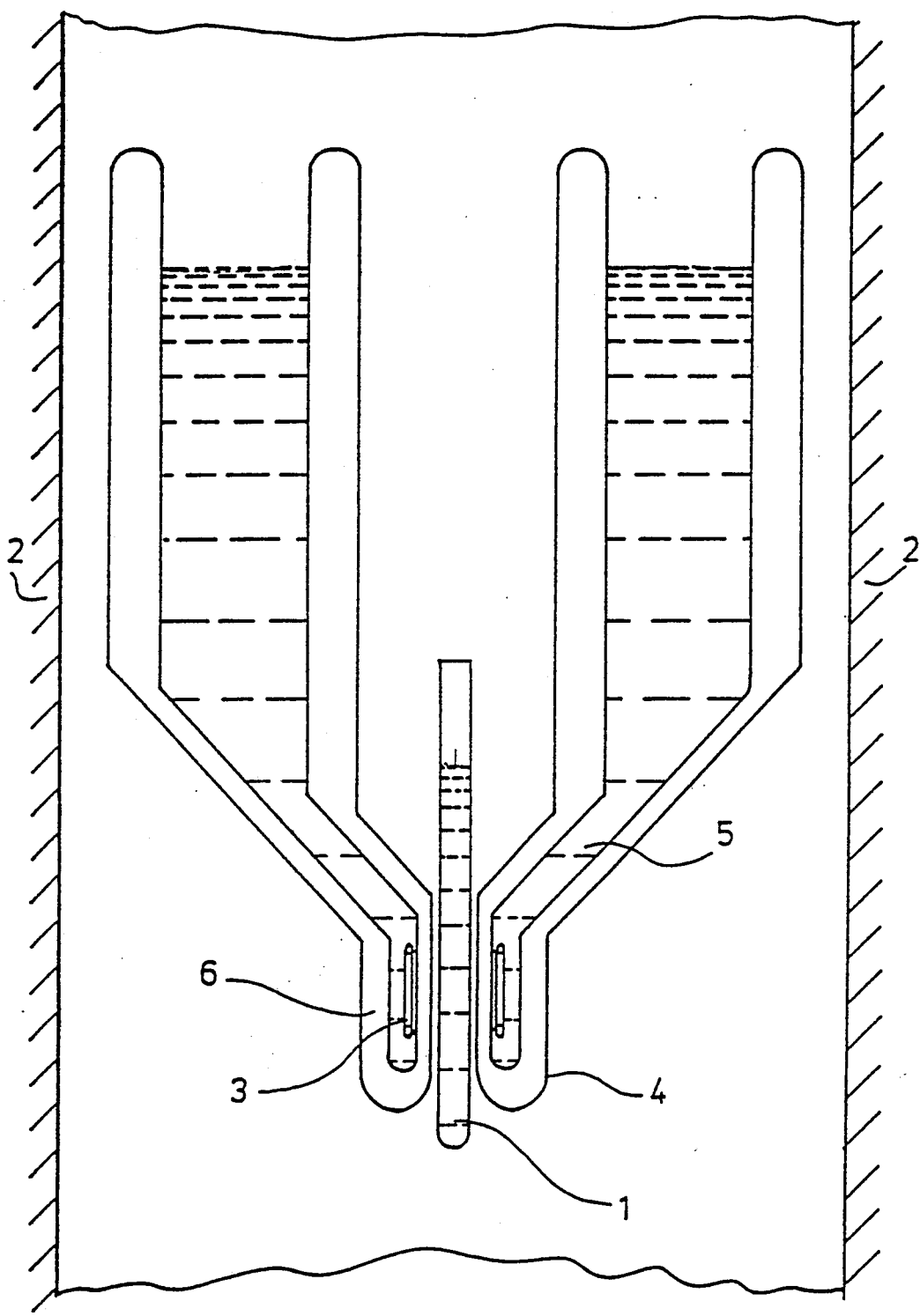
FIG. 1 shows a diagrammatic sectional view through a prior art arrangement comprising a cooled receiver coil in a double-walled glass Dewar.

In the case of the conventional solution illustrated in FIG. 1, the sample 1 is positioned in the homogeneous field of the magnet 2, and is surrounded by the RF receiver coil 3, the latter being arranged in a glass Dewar which is filled with a cryogenic liquid 5 (such as nitrogen or helium) and which displays a double-walled structure with a vacuum 6 enclosed between the two walls. It will be readily seen that in the case of this conventional structure the spacing between the sample 1 and the RF receiver coil 3 is increased at least by the thickness of the two glass walls plus the dimension of the vacuum enclosed therebetween, so that the space factor is reduced significantly relative to its possible optimum. In addition, any bubbles that may possibly rise in the cryogenic liquid 5 may excite vibrations in the RF receiver coil 3, which in turn also impair the measuring result.

Figure 2:
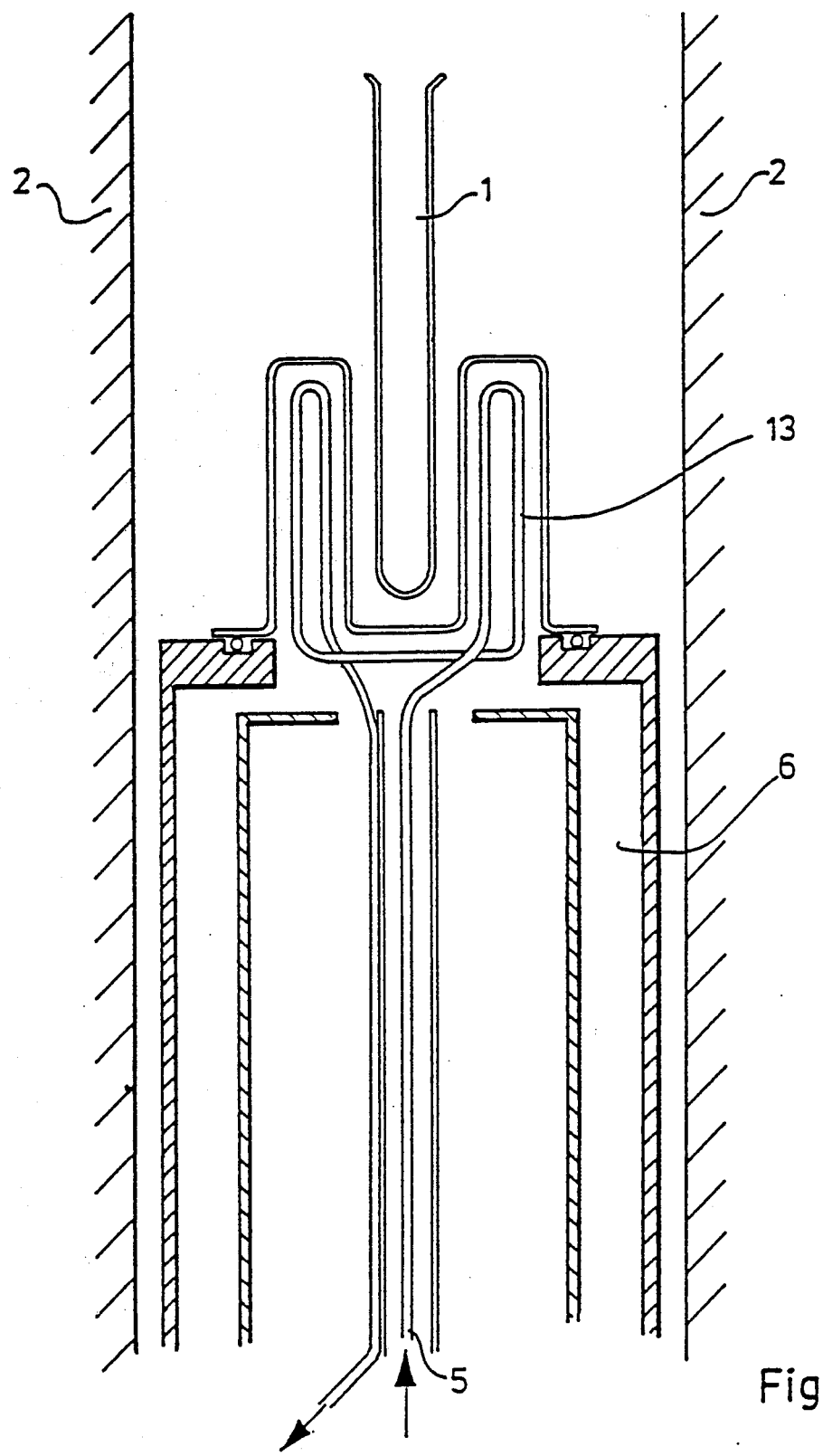
FIG. 2 shows a diagrammatic sectional view of an improved arrangement of the prior art where the receiver coil is cooled from the inside and directly by the cryogenic agent flowing through it.

A better utilization of space and, thus, an improved space factor can be achieved by the prior-art arrangement illustrated in FIG. 2, where a hollow RF receiver coil 13 displaying the shape of a bent tube is passed by the cryogenic liquid 5 and is thereby cooled internally. The hollow RF receiver coil 13 being arranged in the vacuum, there is no need for the two glass walls of the glass Dewar 4 illustrated in FIG. 1. However, this arrangement is connected with the general disadvantage that it considerably restricts the designer's freedom with respect to the structure of the hollow RF receiver coil 13. This applies in particular to the shaping of the tube and, thus, to the geometry of the hollow RF receiver coil 13, which is subject to very strict limitations. It is, therefore, not possible with this arrangement, which besides is extremely difficult to produce, to achieve an optimum space factor. Another problem results from the restrictions regarding the materials suitable for use, which make it difficult to achieve proper susceptibility compensation of the hollow RF receiver coil 13, which in turn leads to additional losses in resolution and measuring sensitivity. An additional problem arises from susceptibility variations caused by vibrations in the hollow RF receiver coil 13 when the latter is passed by the cryogenic liquid 5. In addition, the exchangeability of the hollow RF receiver coil 13 is impaired in this case by the tight connections which are absolutely necessary in this case. Finally, experience shows that in the case of the arrangement illustrated in FIG. 2 the signal-to-noise ratio achievable in experiments reaches only half the value which is expected theoretically.

Figure 3A:
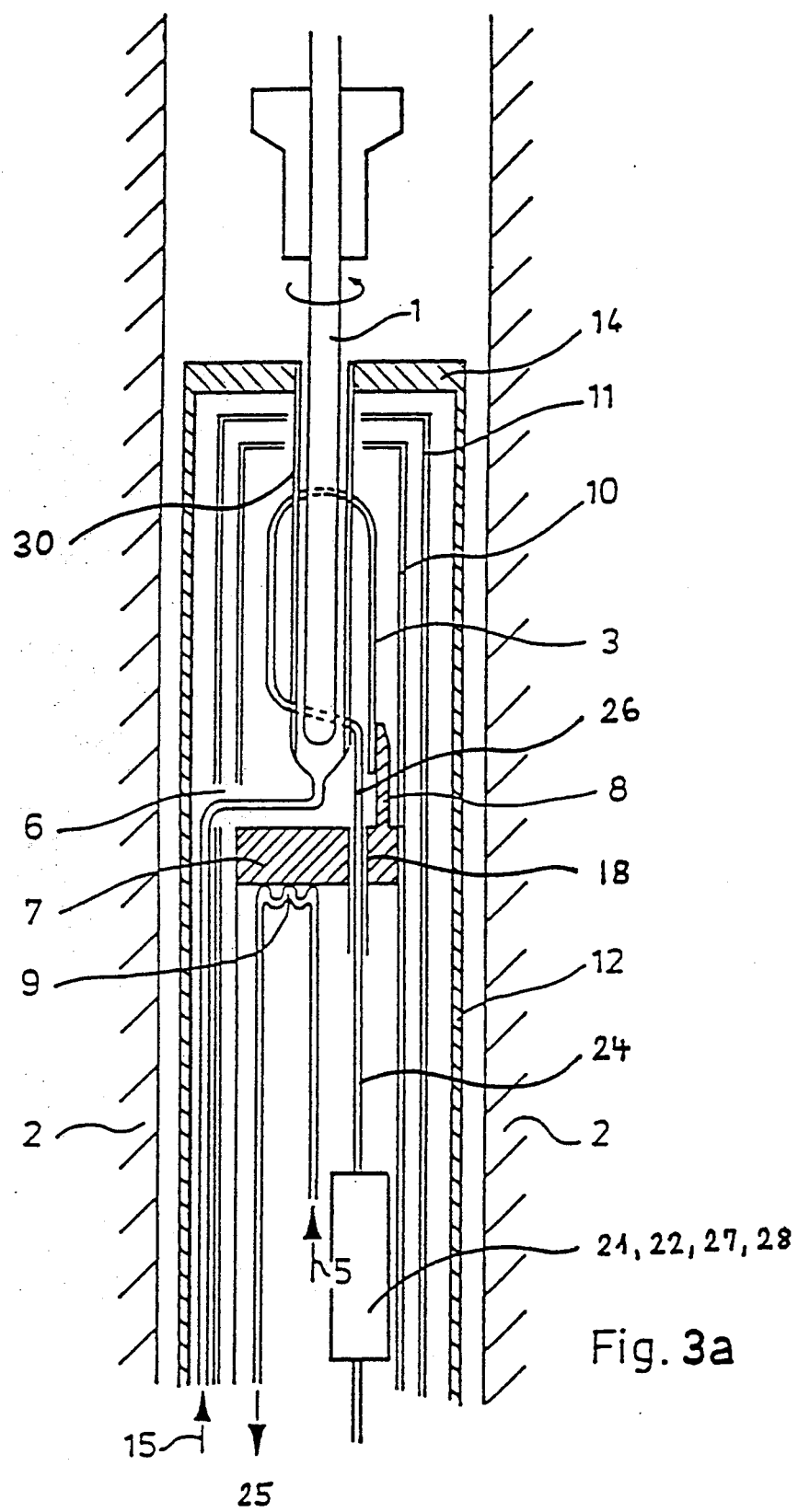
FIG. 3a shows a diagrammatic sectional view of one embodiment of the RF receiver coil arrangement according to the invention.
Figure 3B:
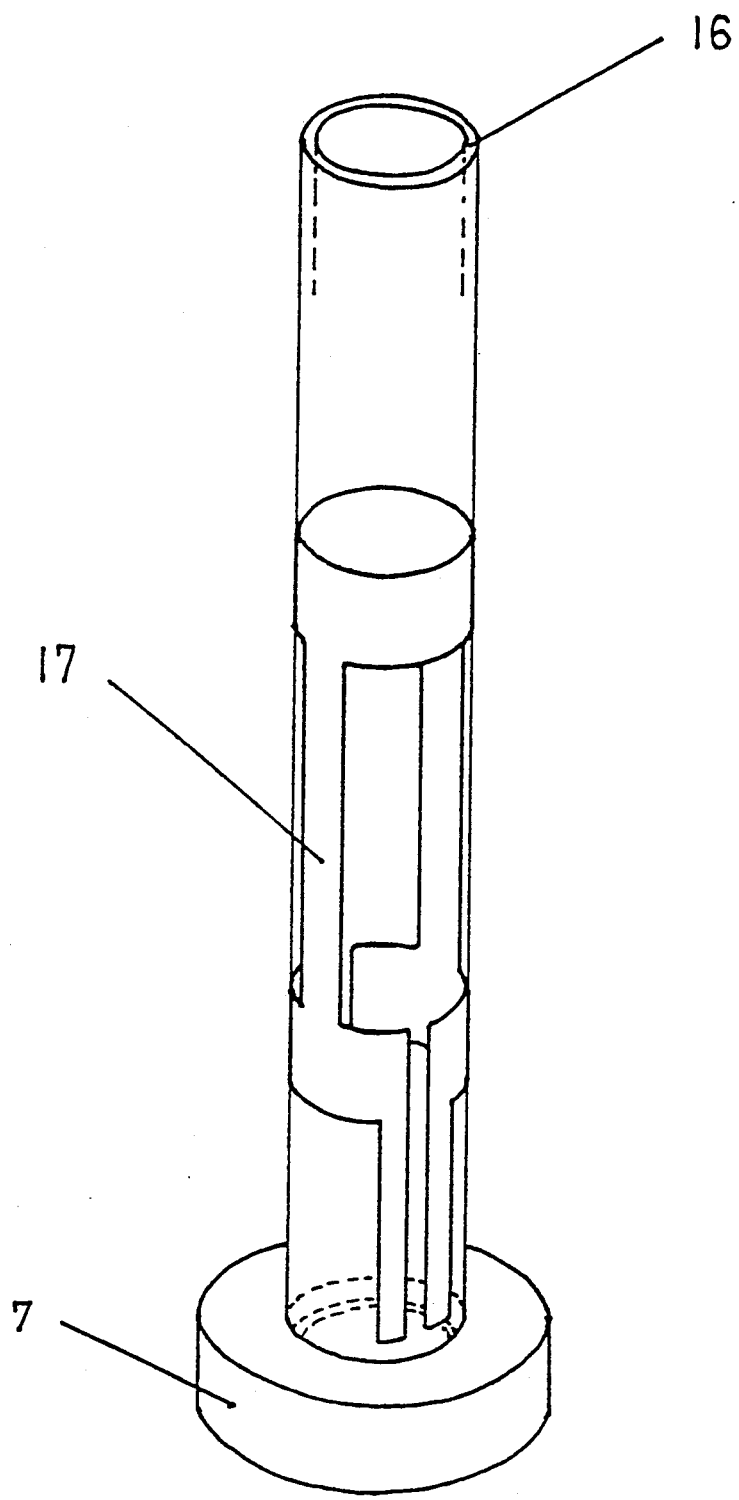
FIG. 3b shows an embodiment of the RF-receiver coil in the form of an electrically conducting layer applied on a substrate.

According to the present invention, the RF receiver coil 3 is likewise arranged in the vacuum 6 so that only one partition wall is required between the coil and the sample 1, as is illustrated in FIG. 3a. However, in the case of the arrangement according to the invention, the RF receiver coil 3 is not cooled internally, but is in thermal contact with a cooled platform 7, or in the case of the illustrated embodiment with a cooling finger 8 projecting from the platform 7. The platform 7 is cooled by a heat exchanger 9 which is passed by the cryogenic liquid 5. The outer wall 10 of the resonator space, too, is in thermal contact with the cooled platform 7 and is, consequently, also at low temperature. Between the cooled outer wall 10 of the resonator and the outer jacket 12 of the measuring head 14, which is kept at room temperature, there is additionally provided a radiation shield 11. For carrying out the measurement, the measuring head 14 and the sample 1 are introduced into the homogeneous field of a magnet 2. The sample 1 rotates on a compressed-air cushion at room temperature.

The temperature of the sample 1 is maintained, and if necessary regulated, by means of a gas flow which flows around the sample 1 and is supplied through a line 15 inside the measuring head 14 and wall 30.

The cold screening of the resonator space leads to a high Q factor of the resonant circuit and reduces in addition the noise component contributed by the screening. In the case of the illustrated arrangement, the RF receiver coil 3 is heated up only by approx. 1 K by the heat radiated from the sample, which is kept at room temperature, and the resulting heat flow.

Direct cooling of the RF receiver coil 3 is effected along the connections, in the embodiment illustrated in FIG. 3a. The coil is designed in such a way as to provide a defined, RF-wise "cold" connection in the coil center, being directly connected to the cooling finger 8. In the embodiment illustrated in FIG. 3c, the RF receiver coil 3 consists of a metal wire of very high electric and thermal conductivity, which may in particular consist in part of high-purity aluminium, copper or silver, while the cooled platform 7 and the cooling finger 8 projecting therefrom consist of a solid copper block.

Figure 3C:
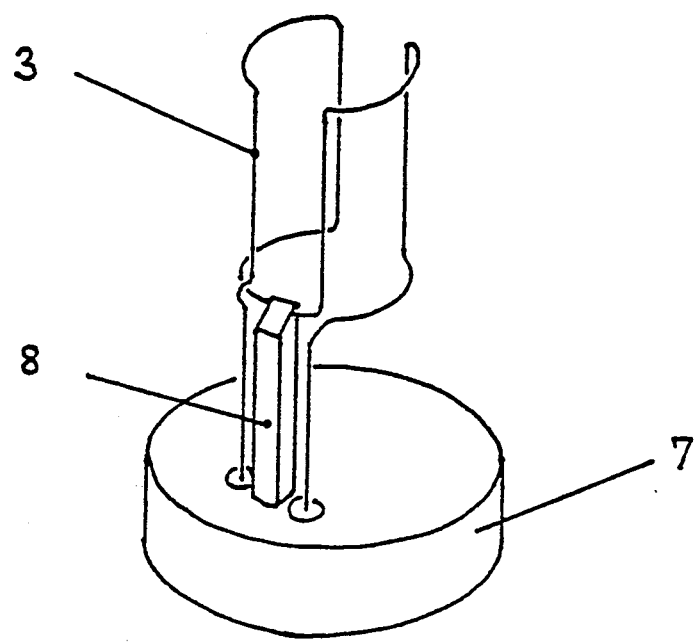
FIG. 3c shows an RF-receiver coil with thermal contact in the coil centre.

According to another embodiment of the invention shown in FIG. 3c, the RF receiver coil 3 consists of an electrically conductive layer 17, in particular a superconductive layer, such as NbTi, applied on a substrate 16. The substrate may consist of a sapphire tube forming the cooled platform 7, either alone or in combination with an attached copper block.

Figure 3D:
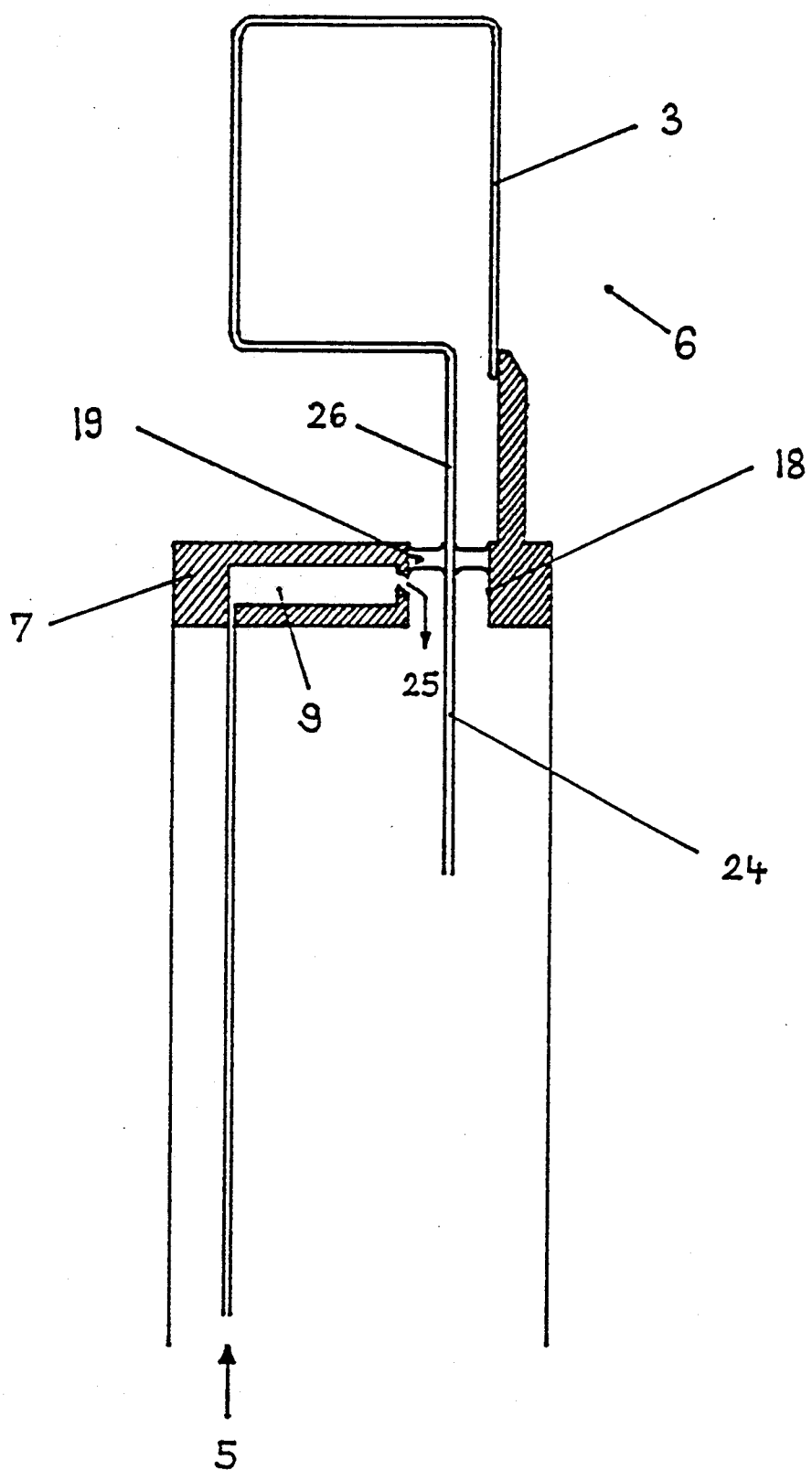
FIG. 3d shows the sealing of the "hot" connection of the RF-coil.
Figure 3E:
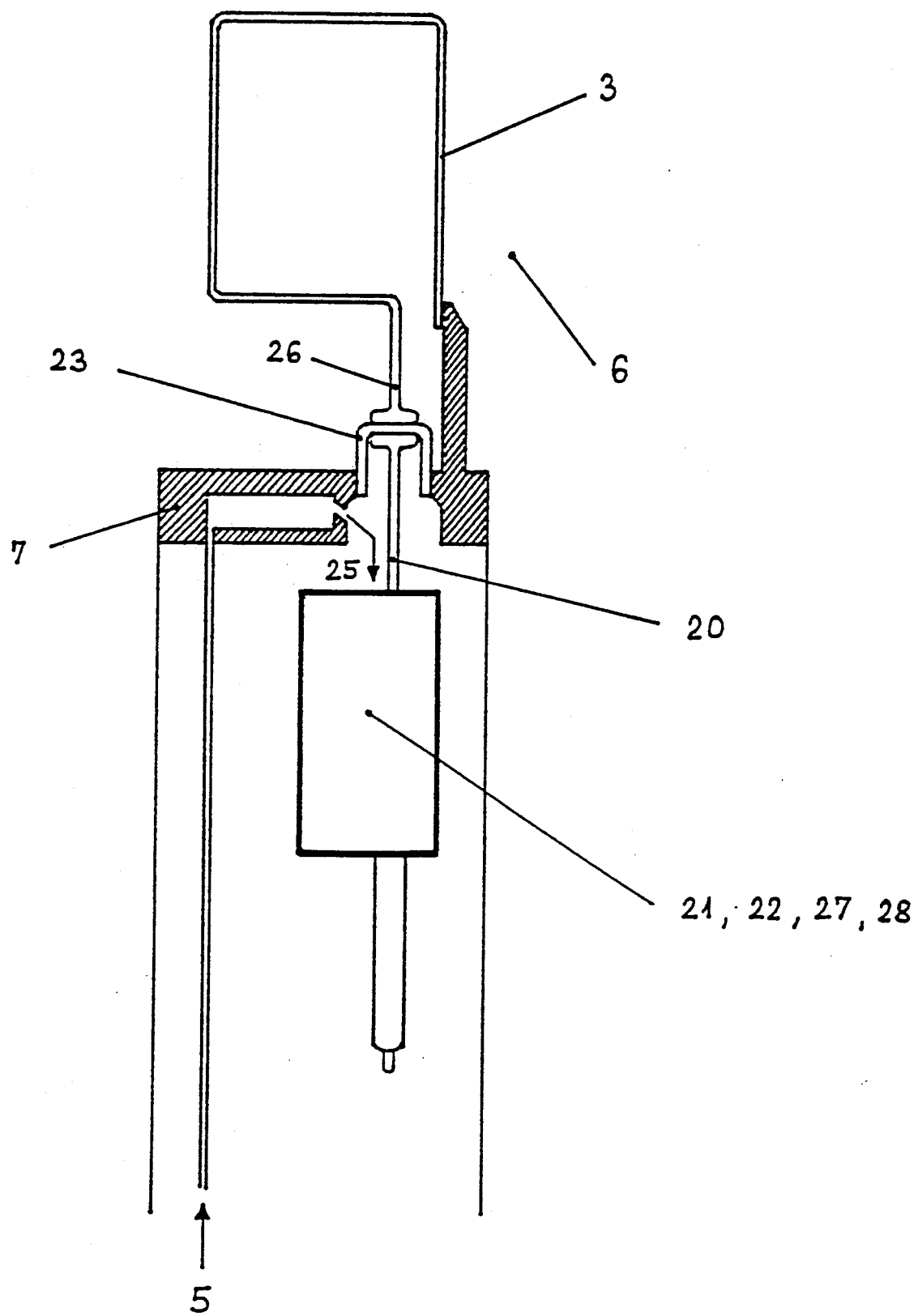
FIG. 3e shows the coupling of the coil by means of a dielectric partition.
Figure 3F:
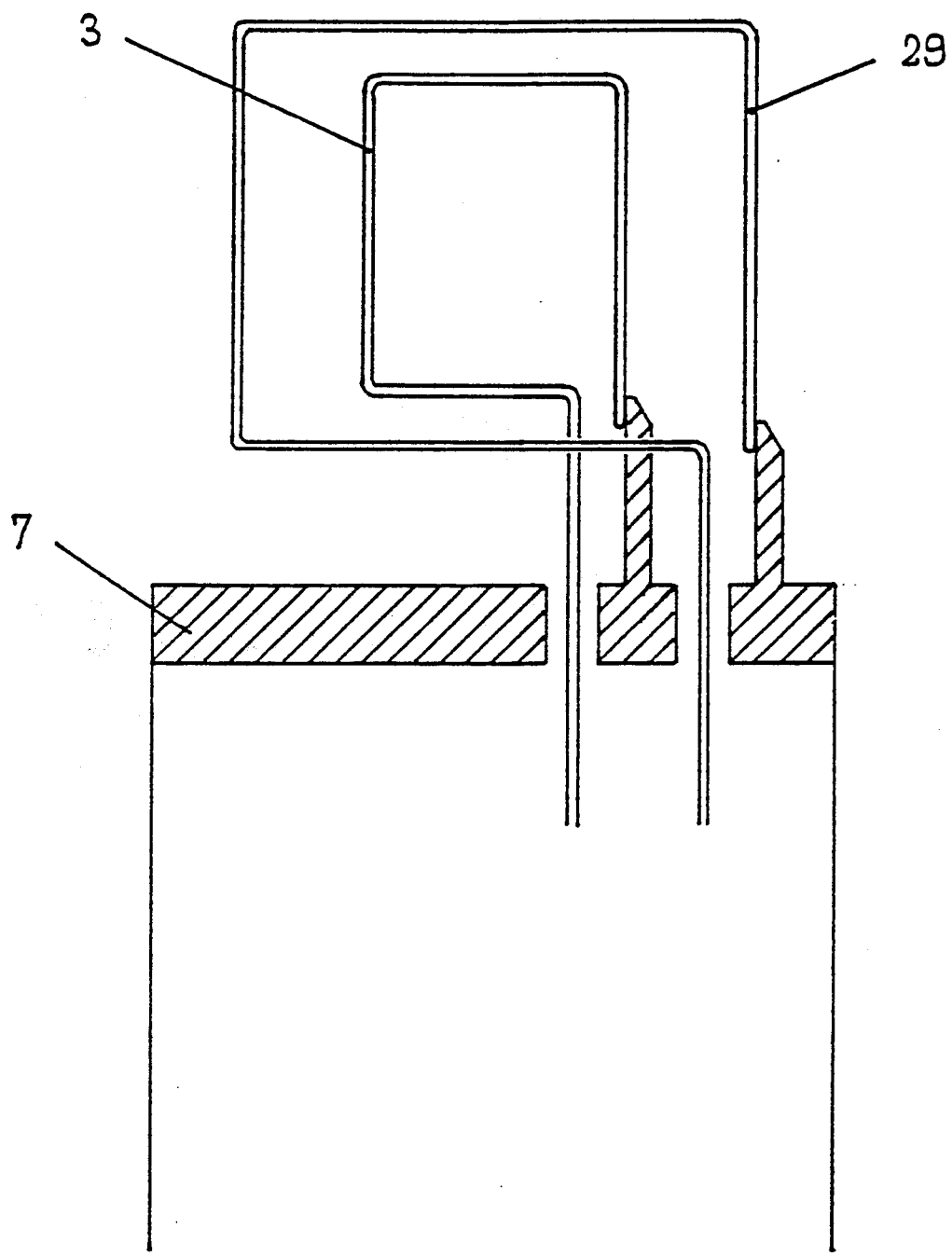
FIG. 3f shows an arrangement with a cooled emitter/decoupler coil (schematic representation without taking the angular relation into consideration)

In the case of the embodiment illustrated in FIG. 3d, a connection of the RF receiver coil 3, 29 is guided through a bore in the platform 7, without any contact with the cooled platform 7, and is cooled by the platform 7 indirectly. Efficient cooling of the RF-wise "hot" connection 20, 26 can be achieved additionally, however, when the connection 20, 26 is coupled to the platform 7 by means of a dielectric 23 of high thermal conductivity, such as sapphire (See FIG. 3e).

According to another embodiment of the invention shown in FIG. 3d however, the annular gap between the bore 18 and the connection 26 passing therethrough may be sealed by an electrically non-conductive material 19 for example a powder metal bushing. The seal in the area of the heat exchanger 9 then defines a space which is sealed off from the vacuum 6 and which, when liquid helium is used for cooling, may accommodate the volatilizing helium return gas 25 which then surrounds, and helps cool, the connection 24 of the RF receiver coil 3 passing through the bushing. If the bushing is made from a dielectric of high thermal conductivity, this leads to even more efficient cooling of the "hot" connection 26.

Under the aspects of practical application of the entire system, the losses in cooling agent during cooled operation of the system are of particular importance. If liquid nitrogen is employed for cooling the system, the liquid nitrogen consumption is relatively moderate, and quite acceptable under the aspects of price and handling. However, if the RF receiver coil 3 is to be cooled down to a lower temperature it may be necessary to use liquid helium for cooling.

The component of the receiver system that must be cooled most efficiently is the RF receiver coil 3 as such. Its temperature should be close to 4.2 K. From this it follows that the coil 3 cannot be cooled using the enthalpy of the gaseous return flow of helium, but that the entire cooling capacity must be covered by the heat of evaporation of the liquid helium. It is, therefore, important that the heat input be kept at a minimum if the RF receiver coil 3 is to be cooled to temperatures near the helium temperature. If in case of the arrangement according to the invention cooling is not required for an entire glass Dewar 4, but only for the RF receiver coil as such, only the latter is exposed to direct room temperature radiation. The rest of the system is protected by one or more radiation shields 11, as described above, and is anyway much less critical for the heat balance, due to the $T^4$ (The Stefan-Boltzmann Law generally applicable to black body radiation) law. Given the fact that the surface of the RF receiver coil 3 is very small, and its reflectivity for infrared radiation is rather high, the cooling capacity required for the RF receiver coil 3 alone amounts to a few milliwatts only, Which corresponds to a helium consumption of a few milliliters per hour.

This initially extremely favorable balance may be impaired by a number of factors:

It is absolutely possible that it may become necessary to operate a second (transmitter or decoupler) coil at helium temperature in order to prevent excessive noise from being coupled into the receiver coil from the hot transmitter/decoupler coil. The resulting heat rise due to radiation would then already lead to double the cooling capacity. The power dissipated in such a transmitter or, in particular, decoupler coil may also be quite considerable. This may lead to a significant increase in consumption of liquid helium. If (depending on the geometry) the dampening or noise component contributed by an uncooled resonator wall (RF screening of the receiver coil) is significant, then it would be advantageous to cool the latter down to a correspondingly low temperature. In the extreme case, this may be the same temperature as that of the receiver coil. This is the case in the embodiment illustrated in FIG. 3a. Consequently, it may become necessary to have all metal walls in the direct neighborhood of the RF receiver coil 3 cooled, too. Cooling of such an RF shield would require many times the cooling capacity necessary for cooling the RF receiver coil 3, if the temperature were to be 4.2 K. If somewhat higher temperatures are acceptable, the enthalpy of the gaseous return flow of helium could be used for cooling so that the total helium consumption Would be increased only insignificantly.

If, for example, a gallium-arsenide pre-amplifier is operated at helium temperature, an additional thermal load results from the latter's dissipated power, which is in the range of 20 mW. In the case of a certain embodiment of the arrangement according to the invention shown in FIG. 3c, however, cooling of the pre-amplifier 22 can be effected also, practically free of cost, using the enthalpy of the return flow of the helium gas which has been used for cooling the receiver coil. The same applies, with certain restrictions, with respect to the maximum operating temperature if a SQUID pre-amplifier is employed.

Further, one must add the other usual sources of losses encountered in any cryostat (radiation, heat conduction along structural components, heat conduction along the RF coaxial cables and the power supply cables, etc.). Adding these factors to the before-mentioned sources of heat, one arrives at helium losses totalling approx. 10 ml per hour in the most favorable and up to some liters per hour in the most disadvantageous of all cases. The latter case might be due, for example, to the dissipation of a decoupler coil cooled down to 4.2 K.

According to one embodiment of the invention shown in FIG. 4 the cryostat is a flow-type cryostat in the form of a usual measuring head 14 which is introduced into the magnet from below. During cooled operation, the flow-type cryostat 31 is continuously connected to the helium supply Dewar 33 by its transfer line 32. In this case, the continuously connected transfer line presents the link with the least efficient insulation in the described cooling arrangement. The losses encountered in the transfer line would dominate all other losses. Consequently, the transfer lines of this embodiment of the invention are likewise cooled by the return flow of the helium gas 25 so that the helium losses that have to be expected due to the transfer lines are in the range of approximately 1 liter per hour only.

From the above explanations it results that if the circumstances are not extremely unfavorable a measuring head 14 With flow-type cooling can be operated with helium losses of approx. 2 liters per hour. Consequently, a helium tank with a capacity of 100 liters would be sufficient for one Work's operation, provided the system is operated during the day only. However, the resulting costs have to be weighed against the enormous increase in efficiency of such a system which more than compensates the additional expense of the liquid helium. The described measuring head 14 With flow-type cooling distinguishes itself by relatively simple handling, its consumption of liquid helium only during actual measuring times, its easy service and its simple structure. The compact design of the arrangement also permits its use in the relatively small magnet bore of a high-field magnet.

Figure 5:
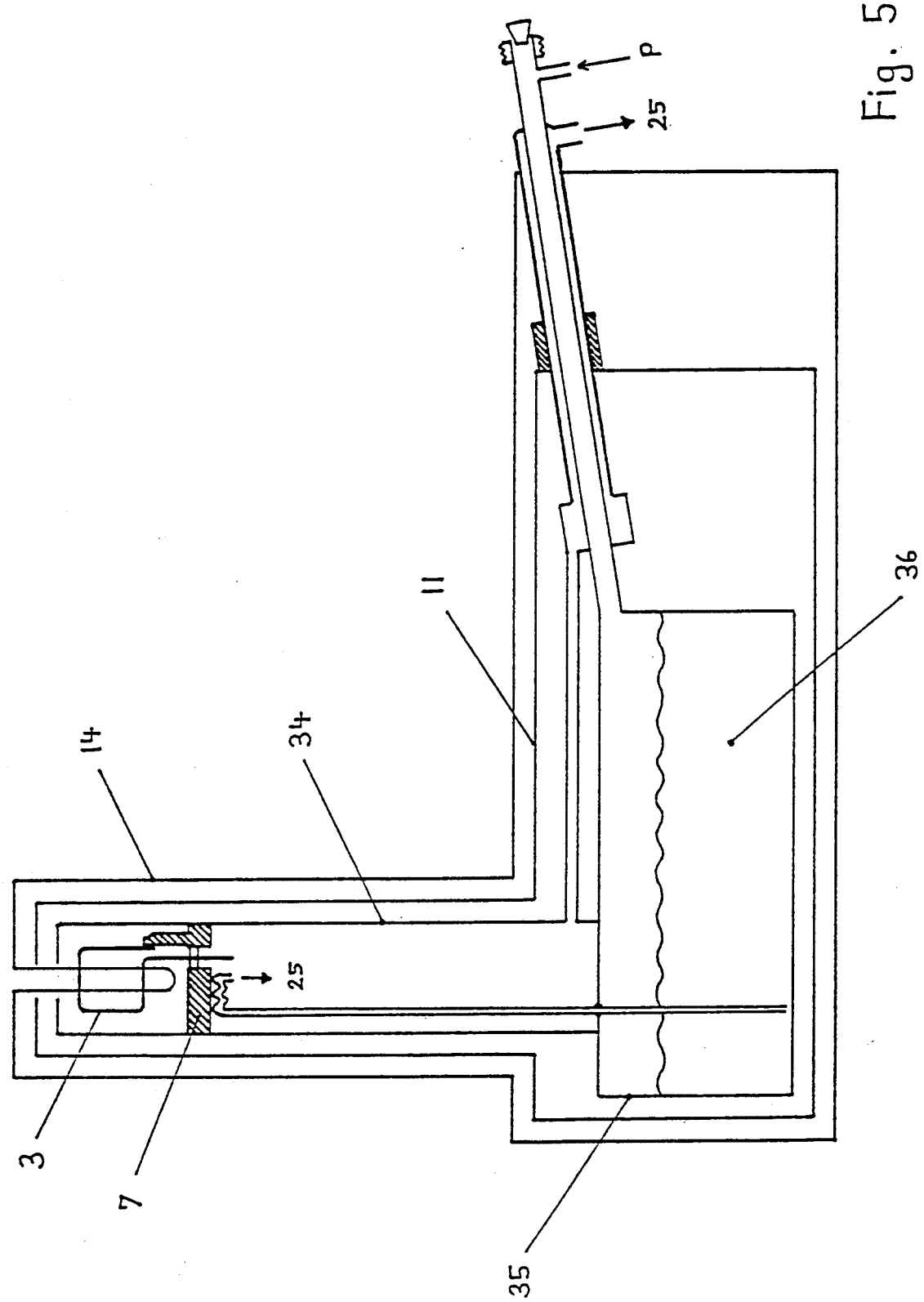
FIG. 5 shows a schematic sectional view of an arrangement with cooling by means of an integrated supply container for the cryogenic liquid.
Figure 6:
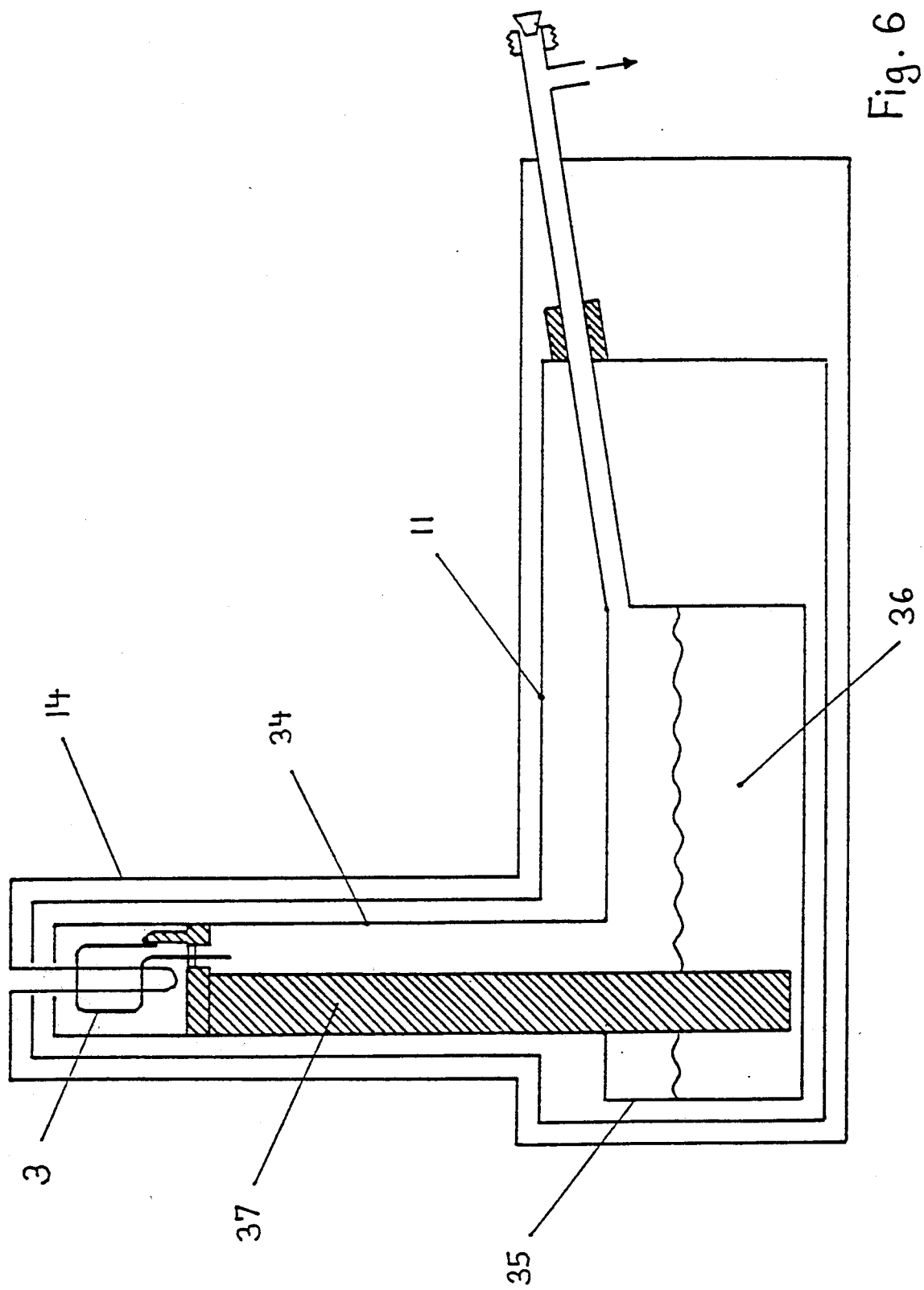
FIG. 6 shows a schematic sectional view of an arrangement, wherein the platform is cooled by means of a metal block which is, at the other end, in contact with the cryogenic liquid of the supply container.

According to embodiments of the invention shown in FIGS. 5 and 6, the measuring head 14 and wall 34 is equipped with an integrated supply vessel 35 with column 37 for liquid helium 36, whereby the helium consumption can be reduced in continuous operation.

Figure 7:
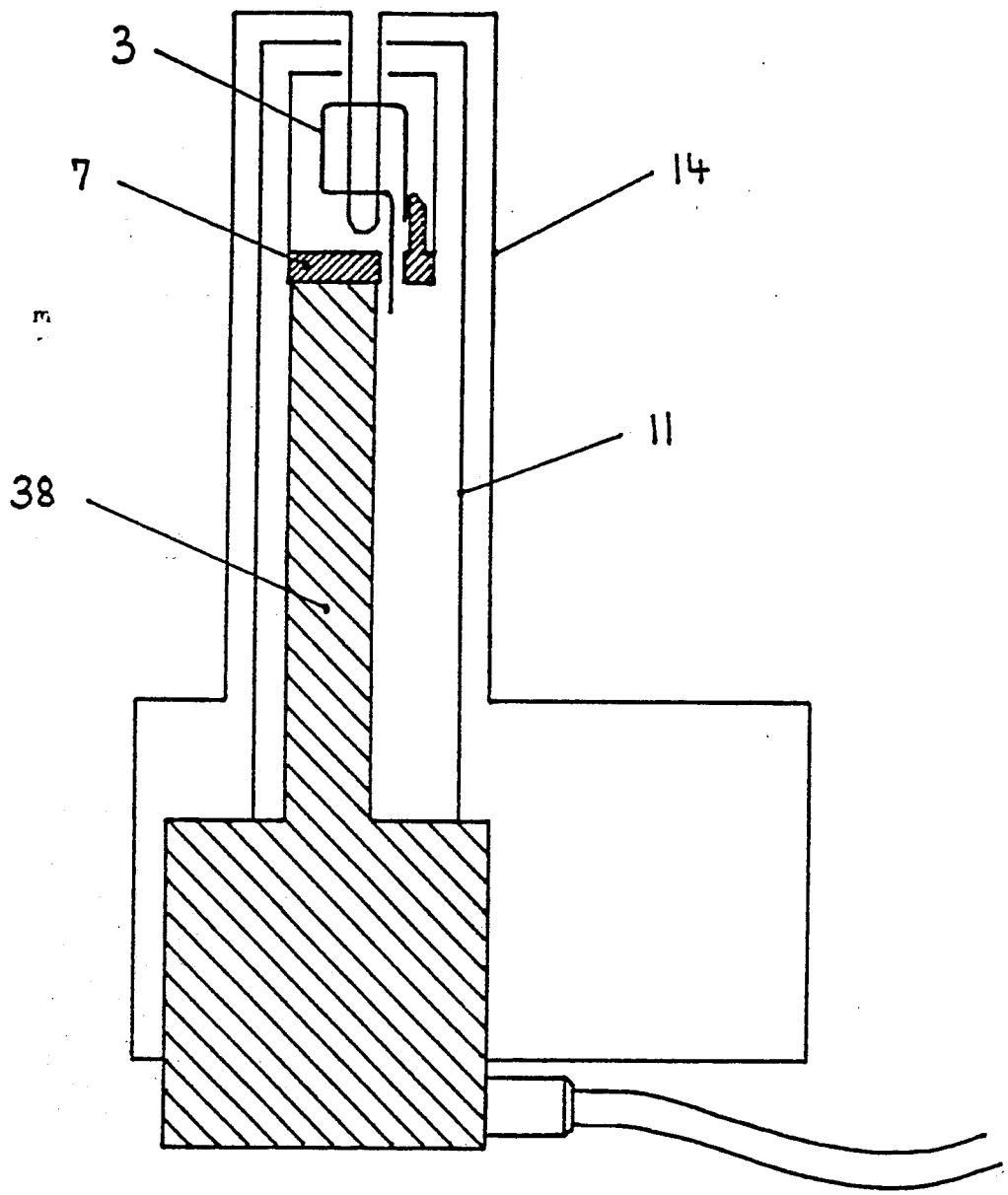
FIG. 7 shows a schematic view of an arrangement wherein the platform is cooled by means of a cryocooler.

According to another embodiment of the invention shown in FIG. 7, the cooling system is designed as cryocooler 38 with a closed cooling circuit, whereby an integrated helium recovery and, if desired, liquifying system is rendered possible.

What is claimed is:

1. RF receiver coil arrangement for NMR spectrometers comprising: RF receiver coil means disposed around a sample and cooled to a temperature far below room temperature, for receiving nuclear magnetic resonance signals from the sample, the sample being positioned in a homogeneous magnetic field and adjusted to at least room temperature and at least some parts of the RF receiver coil being in thermal contact with a cooled platform.

2. RF receiver coil arrangement according to claim 1, wherein the RF receiver coil includes an electrically superconductive layer applied on a substrate.

3. RF receiver coil arrangement according to claim 2, wherein the substrate is a low-loss dielectric of high thermal conductivity at low temperatures, selected from a group consisting of sapphire and quartz.

4. RF receiver coil arrangement according to claim 2, wherein the cooled platform is formed by the substrate in combination with a metal block, which is in thermal contact with the substrate, said metal block being formed from a material selected from a group consisting of Cu and Al.

5. RF receiver coil arrangement according to claim 1, wherein the RF receiver coil comprises a metal wire containing high-purity metal selected from a group consisting of copper and aluminum.

6. RF receiver coil arrangement according to claim 5, wherein the RF receiver coil is in thermal contact with the cooled platform at least along one terminal of the RF receiver coil.

7. RF receiver coil arrangement according to claim 5, wherein the RF receiver coil is in thermal contact with at least one cooling finger projecting from the cooled platform.

8. RF receiver coil arrangement according to claim 5, wherein the RF receiver coil is in thermal contact with the cooled platform at a coil center.

9. RF receiver coil arrangement according to claim 1, wherein the RF receiver coil is arranged in a vacuum, in an area around the sample.

10. RF receiver coil arrangement according to claim 1, wherein the RF receiver coil is enclosed by one or more radiation shields.

11. RF receiver coil arrangement according to claim 1, further comprising liquid nitrogen means for cooling said platform.

12. RF receiver coil arrangement according to claim 1, further comprising liquid helium means for cooling said platform.

13. RF receiver coil arrangement according to claim 1, wherein one terminal of the RF receiver coil passes through a bore in the cooled platform, without contacting the cooled platform.

14. RF receiver coil arrangement according to claim 13, wherein an annular gap between the bore and the one terminal of the RF receiver coil passing therethrough is sealed by an electrically non-conductive material.

15. RF receiver coil arrangement according to claim 13, further comprising means, including a dielectric partition wall, for capacitively coupling the RF receiver coil to one of; lines outside a vacuum space around the RF receiver coil; a transformer network; and a pre-amplifier.

16. RF receiver coil arrangement according to claim 14, wherein the one terminal of the RF receiver coil passing through the cooled platform, is surrounded by helium return gas.

17. RF receiver coil arrangement according to claim 1, further comprising heat conduction means, including a dielectric of high thermal conductivity, in contact with the cooled platform, for cooling an RF-wise "hot" terminal of the RF receiver coil.

18. RF receiver coil arrangement according to claim 15, wherein an outgoing terminal of the RF receiver coil leads to a semiconductor pre-amplifier surrounded by helium return gas, for amplification of the nuclear magnetic resonance signal from the sample.

19. RF receiver coil arrangement according to claim 15, wherein the outgoing terminal of the RF receiver coil leads to a SQUID pre-amplifier, surrounded by helium return gas, for amplification of the nuclear magnetic resonance signal from the sample.

20. RF receiver coil arrangement according to claim 1, wherein an innermost wall facing the RF receiver coil is cooled.

21. RF receiver coil arrangement according to claim 20, wherein the innermost wall comprises a material of low RF losses selected from a group consisting of a metal of high electric conductivity and a superconductor.

22. RF receiver coil arrangement according to claim 1, further comprising a cooled transmitter and/or decoupler coil.

23. RF receiver coil arrangement according to claim 1, wherein the RF receiver coil forms, together with a surrounding cooling system, a measuring head which can be inserted into a magnet establishing the homogeneous magnetic field, said measuring head including means defining a bore therein intended to receive the sample.

24. RF receiver coil arrangement according to claim 23, wherein the cooling system is designed as a flow-through-type cryostat having at least one transfer line to which liquid helium is supplied from a supply tank and which is surrounded by helium return gas during operation of the nuclear magnetic resonance spectrometer.

25. RF receiver coil arrangement according to claim 23, wherein the cryostat is equipped with an integrated supply tank for liquid helium or nitrogen.

26. RF receiver coil arrangement according to claim 23, wherein cooling of the RF receiver coil and RF screening is effected by heat conduction in a metal block selected from a group consisting of high-purity Al and Cu, over distances in the range of half the length of the magnet.

27. RF receiver coil arrangement according to claim 23, wherein the cooling system is designed as a closed cooling circuit.

* * * * *